United States Patent [19]

Iida et al.

[11] Patent Number: 5,278,009

[45] Date of Patent: Jan. 11, 1994

[54] COLOR FILTER AND METHOD OF PRODUCING THE SAME

[75] Inventors: Mitsuru Iida; Seitaro Tsutsumi; Takehiko Ishida, all of Tokyo, Japan

[73] Assignee: Dai Nippon Printing Co., Ltd., Tokyo, Japan

[21] Appl. No.: 834,301

[22] PCT Filed: Jun. 20, 1991

[86] PCT No.: PCT/JP91/00827

§ 371 Date: Feb. 19, 1992

§ 102(e) Date: Feb. 19, 1992

[87] PCT Pub. No.: WO91/20006

PCT Pub. Date: Dec. 26, 1991

[30] Foreign Application Priority Data

Jun. 20, 1990 [JP] Japan .................. 2-161590
Jun. 20, 1990 [JP] Japan .................. 2-161591
Jun. 20, 1990 [JP] Japan .................. 2-161592
Jun. 20, 1990 [JP] Japan .................. 2-161593

[51] Int. Cl.$^5$ .................................. G03F 9/00
[52] U.S. Cl. ............................ 430/7; 359/68; 359/885
[58] Field of Search ............... 430/7; 359/68, 885

[56] References Cited

U.S. PATENT DOCUMENTS 5,045,418 9/1991 Fukuyoshi .................. 430/7
5,051,295 9/1991 Mori et al. .................. 430/7

Primary Examiner—Marion E. McCamish
Assistant Examiner—Mark A. Chapman
Attorney, Agent, or Firm—Dellett and Walters

[57] ABSTRACT

The color filter of the present invention is particularly suitable for a color liquid crystal display (1). Colored pixels (8, 9 and 10) each made of a transparent resin material having a pigment dispersed therein are formed on a transparent substrate (6). The color filter has a protective film (11) formed over the colored pixels by curing a coating film of a photopolymerizable resin composition containing at least a photopolymerizable acrylate oligomer and a multifunctional photopolymerizable acrylate monomer having at least two functional groups in one molecule. The color filter is superior in both heat resistance and light resistance and also excellent in display quality.

11 Claims, 7 Drawing Sheets

COLOR FILTER AND METHOD OF PRODUCING THE SAME

TECHNICAL FIELD

The present invention relates to a color filter having a colored layer superior in both heat resistance and light resistance and a protective layer that has excellent evenness and high strength. More particularly, the present invention relates to a color filter used in a color liquid crystal display and a method of producing the same.

BACKGROUND ART

A liquid crystal display comprises two transparent substrates, for example, glass substrates, provided with transparent electrodes and disposed with a gap of the order of 1 μm to 10 μm provided therebetween, and a liquid crystal material sealed in the gap, wherein the liquid crystal is orientated in a predetermined direction by application of a voltage between the electrodes, thereby forming transparent and opaque portions, and thus displaying an image. In a color liquid crystal display, a color filter for three colors, i.e., red (R), green (G) and blue (B), corresponding to the three primary colors of light are provided over either of the transparent electrode substrates to effect additive color mixture of the three primary colors by the shutter action of the liquid crystal, thereby displaying a desired color.

Such a color filter for a color liquid crystal display comprises a transparent substrate, a colored layer, a protective film, and a transparent electrically conductive film, which are stacked in the mentioned order. The color filter is disposed to face another transparent substrate, which has electrodes or thin-film transistors formed in opposing relation to the colored pixels of the three primary colors, i.e., R, G and B, with a gap of several μm held therebetween, and a liquid crystal substance is sealed in the gap, thereby forming a liquid crystal display.

FIG. 1 is a sectional view of one example of the color liquid crystal display. The color liquid crystal display 1 includes a color filter 2 and an opposing substrate 3 formed with thin-film transistors (TFT) or transparent electrodes. The color filter 2 and the substrate 3 are disposed to face each other across a predetermined gap and bonded together by using a sealing medium 4 formed by mixing reinforcing fibers with an epoxy resin material or the like. A liquid crystal 5 is sealed in the space defined between the color filter 2 and the TFT substrate 3.

The color filter 2 will be explained below more specifically. A substrate 6, for example, a glass substrate, has a black matrix 7 formed thereon so as to divide adjacent colored pixels by using a metal, e.g., chromium, or a resin material colored with a dye or a pigment, thus forming a colored layer comprising colored pixels of the three primary colors, that is, red colored pixels 8, green colored pixels 9, and blue colored pixels 10, which are divided from each other by the black matrix 7. In addition, a protective film 11 is provided over the colored layer to protect it, and a transparent electrode film 12 for driving the liquid crystal is provided over the protective film 11. Further, an orientation layer 13 for orientating the liquid crystal is formed over the transparent electrode film 12.

Hitherto, colored pixels provided on the color filter are formed as follows. A transparent substrate, for example, a glass substrate, is coated with a transparent resin material obtained by adding a photosensitive material, e.g., a dichromate, a chromate, or a diazocompound, to a hydrophilic resin material, e.g., polyvinyl alcohol, polyvinyl pyrrolidone, gelatin, casein, or glue, thereby forming a transparent photosensitive resin layer. Then, a photomask having an opening pattern with a predetermined configuration is placed over the transparent resin layer, and exposure and development are carried out to form a first resin layer, which is then dyed with a desired dye to form first transparent colored pixels. Next, a transparent hydrophobic resin film for preventing dyeing is formed over the first transparent colored pixels in order to prevent migration of the dye. Thereafter, second transparent colored pixels are formed in the same way as in the case of the first transparent colored pixels. By repeating the above-described process, transparent colored pixels of at least two or three different colors are formed on the substrate.

However, the above-described method requires formation of a transparent resin film for preventing dyeing for each color in order to provide transparent colored pixels of a plurality of colors and hence suffers from the disadvantage that the production process is extremely complicated.

In addition, the color filter for a color liquid crystal display has a transparent electrode film formed thereon for driving the liquid crystal. The transparent electrode film is formed mainly by using an ITO film that is a composite oxide comprising indium oxide and tin oxide, which has excellent characteristics. However, since the electrical resistance of the ITO film depends on the film forming temperature, it is necessary in order to obtain an ITO film of low resistance to carry out the film forming process by heating at a temperature of about 300° C. However, the conventional color film having transparent pixels colored by using a dye has a probability that the dye-colored layer will be caused to change color by heat applied during a manufacturing process, e.g., the ITO film formation, or light externally applied during use. Thus, the prior art is limited in the heat resistance and the light resistance, so that the conventional color liquid crystal display equipped with such a color filter is not satisfactory.

It may be considered using a thermosetting resin material which endures the heat treatment in the manufacturing process as a protective film for the color filter. However, in the case of a thermosetting resin material, the protective film is formed over the whole surface of the color filter and it is difficult to limit the area where the protective film is formed to a predetermined region.

If the protective film is formed over the whole surface of the color filter, the color filter and the opposing substrate are bonded by a sealing medium with the protective film interposed therebetween, so that no adequate bond strength can be obtained. In a case where the color filter is judged to be defective in display quality on inspection after the color filter and the opposing substrate have been bonded together and the sealing medium and the tab are successively separated in order to reuse the color filter, if the colored layer has a protective layer on the outer peripheral portion thereof, the transparent electrode film formed on the color filter is undesirably separated together with the sealing medium or the tab, resulting in a failure to reuse the color filter.

Under these circumstances, it has also been a conventional practice to employ a photo-setting resin material which enables a region where it is set to be readily limited by using a photomask, in order to limit the area where the protective film is formed to a specific region. However, a photosensitive polyimide resin material which has heretofore been used as a photo-setting resin material is highly hygroscopic, inferior in the resistance to corrosion from an alkaline solution used in the formation of electrodes or other process and costly and hence undesirable for practical use. In addition, a photosensitive acrylic resin material which has also heretofore been used is inferior in the resistance to heat and also involves the problem that cracks or wrinkles may grow on the color filter when a relatively thick transparent electrically conductive film is formed on the protective film with a view to lowering the electrical resistance.

If the surface of the protective film is not even, the transparent electrode film becomes uneven, so that the gap between the color filter and the opposing substrate varies locally, resulting in differences in the optical rotatory power of the liquid crystal. Thus, unevenness of display results.

Further, if a photo-setting resin material is set by irradiation with light, e.g., ultraviolet light, by using a photomask, it is possible to limit the area where the protective film is formed. In such a case, however, since the protective film is formed in a pattern faithful to the pattern of the photomask, a step corresponding to the thickness of the protective film is produced at the peripheral edge portion of the protective film set. If a transparent electrode film for driving the liquid crystal is formed over such a protective film, it extends as far as the peripheral portion of the substrate beyond the area where the protective film is formed, so that the transparent electrode film is not so thick at the step portion as it is at the even portion. Thus, a problem in terms of strength arises. In particular, when the transparent electrode film is etched in patterns corresponding to a large number of pixels, side etching progresses particularly at the step portion, so that there is a possibility of disconnection of the transparent electrode film.

It is an object of the present invention to provide a color filter having a colored layer comprising colored pixels, which is excellent in both heat resistance and light resistance, and a protective film which is superior in heat resistance, satisfactorily hard and excellent in adhesion to the substrate and which has a gentle step at the peripheral portion of the substrate, and also provide a method of producing the color filter.

DISCLOSURE OF THE INVENTION

The color filter according to the present invention is characterized by comprising transparent colored pixels in which the light transmittance in the light absorbing region on the spectral characteristic curve in the visible region is not more than 20%, while the light transmittance in the light transmitting region is not less than 50%, the transparent colored pixels being provided on a substrate in patterns of a plurality of colors by using a transparent resin material having a pigment dispersed therein which has spectral characteristics to transmit light in a specific region in the visible region, the pigment further having such a particle diameter distribution that particles having a particle diameter of 1 $\mu$m or more comprise not more than 10% of all the pigment particles by weight and particles having a particle diameter in the range of from 0.01 $\mu$m to 0.3 $\mu$m comprise not less than 60% of all the pigment particles by weight. The pigment dispersed in the transparent resin material preferably has such a particle diameter distribution that particles having a particle diameter of 1 $\mu$m or more comprise not more than 5% of all the pigment particles by weight.

The color filter of the present invention is further characterized by employing as a protective film formed over the colored layer a photosensitive acrylic resin material obtained by adding a multifunctional photopolymerizable acrylate monomer having a plurality of functional groups in one molecule to a photopolymerizable acrylate oligomer. The color filter of the present invention is further characterized by employing a photosensitive resin material obtained by adding a multifunctional photopolymerizable acrylate oligomer to a mixture of a photopolymerizable acrylate oligomer and an epoxy resin. In addition, the color filter of the present invention is characterized by employing a photosensitive resin material obtained by adding a multifunctional photopolymerizable acrylate oligomer to a photopolymerizable acrylate oligomer comprising an epoxy acrylate in which a part of the acrylate groups are epoxy groups.

In addition, the color filter of the present invention is characterized in that the protective film is formed by exposing the above-described resin composition coated on the colored layer through a photomask in such a manner that the distance between the photomask and the substrate is greater than the distance therebetween that is proper for exposure, thereby reducing the quantity of light at the peripheral portion of the exposed region so that the step of the protective film becomes gentle.

In addition, the color filter of the present invention is characterized in that a silane coupling agent is coated on a transparent substrate before the formation of the protective film, or a silane coupling agent is mixed with the above-described resin composition, thereby increasing the strength of the transparent substrate and the protective film at the peripheral portion of the latter.

BEST MODE FOR CARRYING OUT THE INVENTION

Figure 1:
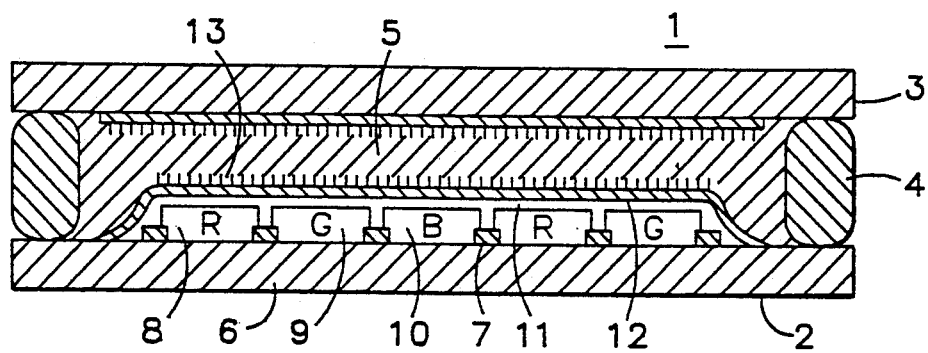
FIG. 1 shows a sectional view of a color liquid crystal display.

The color filter according to the present invention is characterized by comprising transparent colored pixels in which the light transmittance in the light absorbing region on the spectral characteristic curve in the visible region is not more than 20%, while the light transmittance in the light transmitting region is not less than 50%, the transparent colored pixels being provided on a substrate in patterns of a plurality of colors by using a transparent resin material having a pigment dispersed therein which has spectral characteristics to transmit light in a specific region in the visible region, the pigment further having such a particle diameter distribution that particles having a particle diameter of 1 μm or more comprise not more than 10% of all the pigment particles by weight and particles having a particle diameter in the range of from 0.01 μm to 0.3 μm comprise not less than 60% of all the pigment particles by weight. The pigment dispersed in the transparent resin material preferably has such a particle diameter distribution that the particles having a particle diameter of 1 μm or more comprise not more than 5% of all the pigment particles by weight.

The color filter of the present invention is further characterized by employing as a protective film formed over the colored layer a photosensitive acrylic resin material obtained by adding a multifunctional photopolymerizable acrylate monomer having a plurality of functional groups in one molecule to a photopolymerizable acrylate oligomer. The color filter of the present invention is further characterized by employing a photosensitive resin material obtained by adding a multifunctional photopolymerizable acrylate oligomer to a mixture of a photopolymerizable acrylate oligomer and an epoxy resin. In addition, the color filter of the present invention is characterized by employing a photosensitive resin material obtained by adding a multifunctional photopolymerizable acrylate oligomer to a photopolymerizable acrylate oligomer comprising an epoxy acrylate in which a part of the acrylate groups are epoxy groups. In addition, the color filter of the present invention is characterized in that the protective film is formed by exposing the above-described resin composition coated on the colored layer through a photomask in such a manner that the distance between the photomask and the substrate is greater than the distance therebetween that is proper for exposure, thereby reducing the quantity of light at the peripheral portion of the exposed region so that the step of the protective film becomes gentle.

With the above-described arrangement, it is possible to obtain a colored layer which is excellent in display quality and superior in both heat resistance and light resistance and a protective film which is increased in the degree of crosslinking so as to be rigid and hard, so that no crack or wrinkle will grow even if a thick transparent electrode film is formed over the protective film. Even when recesses are formed between adjacent colored pixels or the upper sides of colored pixels are uneven, irregularities in the surface of the protective film at positions corresponding to the uneven portions are extremely small, so that it is possible to obtain a protective film which has extremely small irregularities in the surface and which is therefore excellent in evenness.

Pigments which are generally employed for colored pixels have a particle diameter which is considerably larger than that of the pigment employed in the present invention and are therefore unsatisfactory in terms of transparency. For this reason, the conventional pigments are not used for purposes in which transmitted light is utilized. Even if such a conventional pigment is used for a color filter or the like, no product that has an adequate sensitivity can be obtained because of the low transmittance. If such a color filter is used for a color liquid crystal display, the brightness of the image obtained is not satisfactory. In addition, the scattering of light by the pigment particles is large, so that the polarization is disordered. Accordingly, in a liquid crystal display that effects display by utilization of polarization, image display characteristics such as contrast ratio deteriorate.

Further, the present invention makes use of the characteristics that the lowering of the light transmittance due to the scattering of light is reduced and the transparency of the resulting colored pixels increases to a level adequate for practical use by setting the particle diameter of a pigment dispersed in a transparent resin material so as to be not larger than the wavelength of incident light and also setting the particle diameter distribution of the pigment within a specific range.

Examples of the above-described transparent resin material usable in the present invention are photosensitive resin materials having a photosensitive group, and transparent resin materials endowed with photosensitivity by a photo-crosslinking agent. In particular, water-, oil- or alcohol-soluble photosensitive resin materials are preferable. More specifically, compounds mentioned below are usable.

(A) Water-soluble photosensitive resins having a photosentive group:

Polyvinyl alcohol derivative resins, e.g., polyvinyl alcohol resin, and polyvinyl alcohol/stilbazolium resin.

(B) Oil-soluble photosensitive resins having a photosensiive group:

Photo-crosslinkable photosensitive resins, e.g., cinnamic acid compound, photodecomposition crosslinking photosensitive resins, e.g., bisazide compound, photodecomposition polarity change type photosensitive resins, e.g., o-quinonediazide compound, etc.

(C) Combinations of binder resins (1) and photo-crosslinking agents (2) such as those mentioned below.

(1) Binder resins:
  (i) animal proteins, e.g., gelatin, casein, and glue;
  (ii) celluloses, e.g., carboxymethylhydroxyethyl cellulose, hydroxyethyl cellulose, hydroxypropyl cellulose, and methyl cellulose;
  (iii) vinyl polymers, e.g., polyvinyl alcohol, polyvinyl pyrrolidone, polyvinyl methyl ether, polyacrylic acid, polyacrylamide, polydimethyl acrylamide, and copolymers of these polymers;
  (iv) ring-opening polymers, e.g., polyethylene glycol, and polyethylene imine;
  (v) condensates, e.g., water-soluble nylon; and
  (vi) oil-soluble resins, e.g., butyral resin, styrene-maleic acid copolymer, chlorinated polyethylene or chlorinated polypropylene, polyvinyl chloride, vinyl chloride-vinyl acetate copolymer, polyvinyl acetate, acrylic resin, polyamide, polyester, phenol resin, and polyurethane resin.

(2) Photo-crosslinking agents:
  Dichromates, chromates, diazocompounds, bisazide compounds, etc.

(D) Combinations of the above-mentioned binder resins (1) and the following monomers or oligomers (2) and initiators (3).

(2) Monomers or oligomers:
  Acrylic acid, methacrylic acid, 2-hydroxyethyl acrylate, 2-hydroxypropyl acrylate, 2-hydroxypropyl methacrylate, vinyl acetate, N-vinyl pyrrolidone, acrylamide, methacrylamide, N-hydroxymethyl acrylamide, N-(1,1-dimethyl-3-oxobutyl) acrylamide, polyethylene glycol diacrylate, polyethylene glycol dimethacrylate, methylene bisacrylamide, 1,3,5-triacryloyl-1,3,5-triazocyclohexane, pentaerythritol triacrylate, styrene, vinyl acetate, various kinds of acrylic ester, various kinds of methacrylic ester, acrylonitrile, etc.

(3) Initiators:
- (i) photodecomposition type initiators, e.g., azobisisobutyronitrile, benzoin alkyl ether, thioacridone, benzil, N-(alkyl sulfonyloxy)-1,8-naphthalene dicarboxyimide, 2,4,6-tri(trichloromethyl) triazine, etc;
- (ii) hydrogen transfer type initiators, e.g., benzophenone, anthraquinone, 9-phenylacridine, etc.
- (iii) electron transfer type composite initiators, e.g., benzanthrone/triethanolamine, Methylene Blue/benzene sulfinate, triarylimidazolyl dimer/Michler's ketone, carbon tetrachloride/manganese carbonyl, etc.

In the present invention, a pigment is dispersed in a transparent resin material such as those described above to obtain a transparent resin composition for forming transparent colored pixels.

In this specification, the term "pigment" is employed to mean coloring powders which are only slightly soluble in water or an organic solvent, including organic and inorganic pigments. It should be noted that a certain kind of dye is only slightly soluble in water or an organic solvent and this kind of dye may be employed as "pigment" in the present invention.

Examples of organic pigments usable in the present invention include azo-lake pigments, insoluble azo-pigments, condensation azo-pigments, phthalocyanine pigments, quinacridone pigments, dioxazine pigments, isoindolenone pigments, anthraquinone pigments, perinone pigments, thioindigo pigments, perylene pigments, and mixtures of these pigments.

Examples of inorganic pigments usable in the present invention include Milori blue, cobalt violet, manganese violet, ultramarine blue, Prussian blue, cobalt blue, cerulean blue, viridian, emerald green, cobalt green, and mixtures of these pigments.

It is preferable that the pigment dispersed in the transparent resin material have such a particle diameter distribution that particles having a particle diameter of 1 $\mu$m or more comprise not more than 10%, preferably not more than 5%, more preferably not more than 2% of all the pigment particles by weight. If pigment particles having a particle diameter of 1 $\mu$m or more are dispersed in the photosensitive resin material in excess of 10% of all the pigment particles, the light transmittance lowers undesirably due to the scattering of light and the like. On the other hand, the pigment that is employed in the present invention needs to have such a particle diameter distribution that particles having a particle diameter in the range of from 0.01 $\mu$m to 0.3 $\mu$m comprise not less than 60% of all the pigment particles by weight. By satisfying both the above-described conditions for the particle diameter distribution, it is possible to suppress effectively the lowering in the light transmittance due to the scattering of light and hence possible to obtain excellent spectral characteristics suitable for the color filter.

A pigment having such a particle diameter distribution and a transparent photosensitive resin material are mixed together in a solid content ratio of 1/10 to 2/1, preferably 1/5 to ½, thereby obtaining a photosensitive resin composition for forming transparent colored pixels. A proper combination of a pigment and a transparent resin material is selected by taking into consideration the spectral characteristics of the pigment and those of the transparent resin material.

To form transparent colored pixels having a pigment dispersed therein which has a desired particle diameter distribution such as that described above, first, the pigment that has been considerably finely powdered and a solution of a transparent resin selected from those described above are mixed together, and the resulting mixture is ground in a pigment dispersing mill, e.g., a triple roll mill, a ball mill, or a sand mill. After the pigment has been thoroughly dispersed, the dispersion is centrifuged or filtered by using a glass filter, a membrane filter or the like to remove relatively large pigment particles having a particle diameter of 1 $\mu$m or more, thereby obtaining a pigment-containing transparent resin composition. Alternatively, the pigment is mixed with a solution of a binder resin which is compatible with the transparent resin, and after the pigment has been thoroughly dispersed in the same way as the above, the dispersion is centrifuged or filtered by using a glass filter, a membrane filter or the like to remove relatively large pigment particles having a particle diameter of 1 $\mu$m or more, thereby forming a coloring agent, which is then mixed with the above-described transparent resin, thus forming a pigment-containing transparent resin composition.

It is preferable to add a nonionic surface active agent as a dispersant for improving the dispersibility of the pigment when it is dispersed into the transparent resin. It is also preferable that the viscosity of the transparent resin composition or the coloring agent, in which the pigment is dispersed, should be adjusted to 500 cps (temperature: 25° C.) or less when pigment particles having a relatively large particle diameter are removed from the composition or the coloring agent.

Next, one example of the method of producing transparent colored pixels constituting a color filter by employing a transparent resin composition prepared as described above will be explained with reference to the drawings.

Figure 2A:
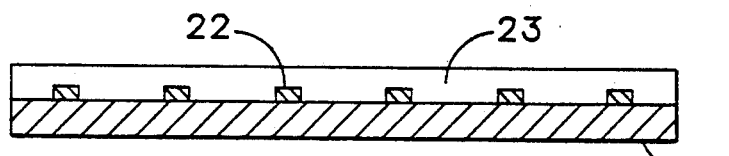
FIGS. 2a-2d shows a process for producing a color filter.
Figure 2B:
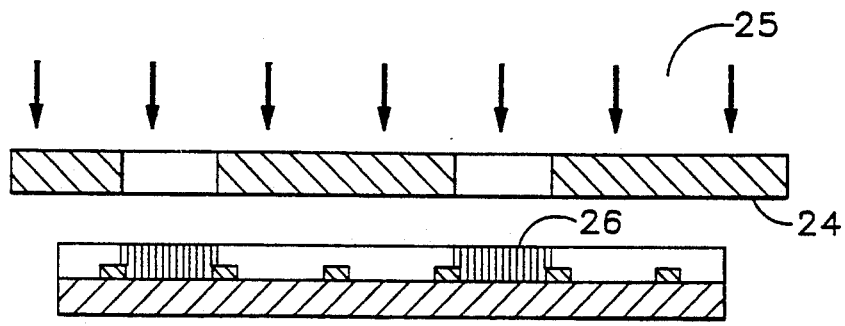
Figure 2C:
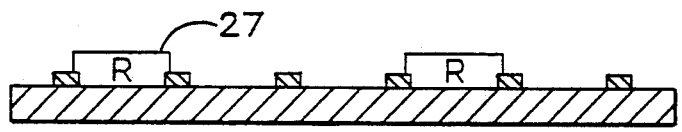
Figure 2D:
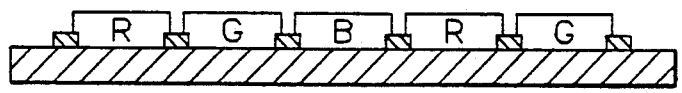

As shown in FIG. 2(A), after a black matrix 22 is formed on a transparent substrate 21, a pigment-containing photosensitive resin composition prepared as described above is coated over the substrate 22 by a coater, e.g., a spin coater, a roll coater, a dip coater, a wheel coater, or a bar coater, so that the thickness of the dry film is on the order of 0.1 $\mu$m to 10 $\mu$m, preferably 0.5 $\mu$m to 3 $\mu$m, thereby forming a resin coating layer 23 for colored pixels. After being dried, the coating layer 23 is irradiated with ionizing radiations 25, e.g., ultraviolet rays, by using a light source, e.g., a xenon lamp, a metal halide lamp, or an extra-high pressure mercury lamp, through a photomask 24 having predetermined opening patterns, thereby effecting pattern exposure, as shown in FIG. 2(B). As a result of the pattern exposure, exposed portions 26 corresponding to the pattern are formed on the coating layer 23. In the case of a negative photosensitive resin, insolubilized portions are formed, whereas, in the case of a positive photosensitive resin, solubilized portions are formed. Then, the solubilized portions are selectively removed by spray development or dip development with water or a developing solution comprising, for example, water and an organic solvent, as shown in FIG. 2(C). Upon completion of the above-described process, first colored pixels 27 are formed. Thus, by repeating a similar process a plurality of times, transparent colored pixels of a plurality of colors can be provided on the substrate without forming a transparent resin film for preventing dyeing, as shown in FIG. 2(D).

For example, as stated in Examples described later, first, a coating film of a transparent photosensitive resin composition (the light transmittance in the light absorbing region after the formation of the coating film of this photosensitive resin is not more than 20%, and the light transmittance in the light transmitting region is not less than 50%), in which is dispersed a pigment of a first hue selected from among red, green and blue, is formed on a transparent substrate according to the above-described process. Then, the coating film of the photosensitive resin composition is exposed through photomask patterns, and the coating film exposed in this way is developed to thereby form first patterned transparent colored pixels on the transparent substrate. Then, for a second hue and, if necessary, for a third hue, a process similar to that for the first patterned transparent colored pixels, described above, is repeated to form second and third patterned transparent colored pixels, thereby obtaining a color filter.

In this case, the transparency of the colored pixels of the color filter obtained as an end product is determined by the kind of transparent resin employed as a base, the kind and amount of pigment dispersed in the transparent resin, the thickness of the colored pixel layer provided on the substrate, etc. First, it is preferable that a transparent resin that is employed as a base have a light transmittance of not lower than 80%, preferably not lower than 90%, more preferably not lower than 95%, in the entire range of from 400 nm to 700 nm, which is the visible region. A pigment is dispersed into the transparent resin that forms a base, and the resulting dispersion is coated on a substrate to a predetermined film thickness. After the formation of the coating film, the light transmittance in the absorbing region is preferably not more than 20%, more preferably not more than 10%, and at the same time, the light transmittance in the transmitting region is preferably not less than 50%, more preferably not less than 60%, although the absorbing and transmitting regions change in accordance with the kind of pigment employed.

It is assumed that when the above-described conditions are satisfied, the colored pixels of the color filter can be regarded as "transparent".

It should be noted that a transparent glass, a transparent resin film, etc. may be employed as a transparent substrate.

Next, a protective film of a photopolymerizable resin composition which is formed over the colored layer will be explained in detail.

Photopolymerizable acrylate oligomers having a molecular weight of the order of 1,000 to 2,000 are preferably used for the protective film of the color filter according to the present invention. Examples of such oligomers are polyester acrylates, epoxy acrylates, e.g., phenolic novolak epoxy acrylate, and o-cresol novolak epoxy acrylate, polyurethane acrylates, polyether acrylates, oligomer acrylates, alkyd acrylates, polyol acrylates, melamine acrylates, and oligomers in which a part of the acrylate groups are epoxy groups.

Examples of epoxy resins which can be mixed with a photopolymerizable resin composition are phenol novolak type epoxy resins represented by the structural formula 1 and cresol novolak type epoxy resins represented by the structural formula 2.

Structural formula 1:

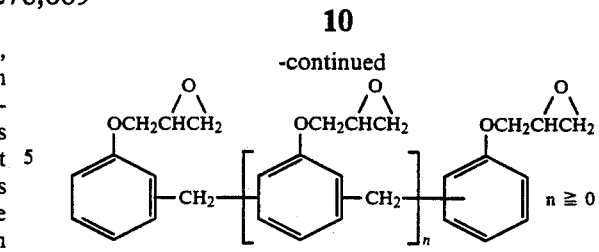

Structural formula 2:

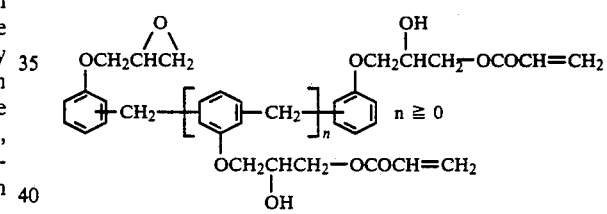

In the case of employing an acrylate oligomer comprising an epoxy acrylate in which a part of the acrylate groups are epoxy groups, the proportion of epoxy groups in the oligomer is preferably set 10 parts to 40 parts by weight of epoxy groups, to satisfy the conditions where the resin is set on irradiation with ultraviolet rays.

An epoxy acrylate can be produced by a reaction of a glycidyl ether with acrylic acid in such a manner that the epoxy groups of the precursor are allowed to remain. One example of such oligomers is shown below.

Structural formula 3:

Examples of multifunctional photopolymerizable acrylate monomers are 1,4-butanediol diacrylate, diethylene glycol diacrylate, neopentyl glycol diacrylate, pentaerythritol triacrylate, trimethylolpropane triacrylate, pentaerythritol acrylate, dipentaerythritol hexaacrylate, etc.

In addition, if a photopolymerizable acrylate monomer or oligomer is given an alkali-reactive group, e.g., a carboxyl group, it becomes capable of being developed with an alkaline aqueous solution, so that the handling of the developing solution and the disposal of the waste liquor are facilitated in comparison with the development using an organic solvent. Thus, the use of such a photopolymerizable acrylate monomer or oligomer is preferable from the viewpoint of economy and safety.

It is also possible to add an initiator, e.g., benzophenone, Irgacure 184, Irgacure 907, Irgacure 651 (trademarks; manufactured by Ciba-Geigy Ltd.), or Darocure (trademark; manufactured by Merck & Co., Inc.), to the photopolymerizable resin material in a solid content ratio of about 1 to 3%.

In addition, a photocationic catalyst such as an aryl diazonium salt is added as an epoxy curing agent. Epoxy curing agents comprising amines are not preferable because these agents cause the resin to yellow.

If a silane coupling agent is coated on a transparent substrate before the coating of the resin composition or it is added to the resin composition, the bond strength can be increased. In this case, a large variety of commercially available silane coupling agents can be used, but it is particularly preferable to use γ-(2-aminoethyl)-aminopropyl trimethoxy silane, γ-aminopropyl triethoxy silane, γ-glycidoxypropyltrimethoxy silane, etc.

The following are particularly preferable examples of the composition of a photopolymerizable acrylate oligomer, an epoxy resin and a multifunctional photopolymerizable monomer.

| Composition Example 1: | |
|---|---|
| Phenol novolak epoxy acrylate | ... 60% |
| Trimethylolpropane triacrylate | ... 17% |
| Dipentaerythritol hexaacrylate | ... 20% |
| Irgacure 184 | ... 3% |
| Composition Example 2: | |
| o-cresol novolak epoxy acrylate | ... 60% |
| Dipentaerythritol hexaacrylate | ... 38% |
| Irgacure 184 | ... 2% |
| Composition Example 3: | |
| Polyurethane acrylate | ... 50% |
| Dipentaerythritol hexaacrylate | ... 48% |
| Irgacure 651 | ... 2% |
| Composition Example 4: | |
| Melamine acrylate | ... 70% |
| Trimethylolpropane triacrylate | ... 27% |
| Irgacure 184 | ... 3% |
| Composition Example 5: | |
| Phenol novolak epoxy acrylate | ... 40% |
| Phenol novolak type epoxy resin | ... 18% |
| Trimethylolpropane triacrylate | ... 17% |
| Dipentaerythritol hexaacrylate | ... 20% |
| Irgacure 184 | ... 3% |
| UVE1014 (manufactured by GE) | ... 2% |
| Composition Example 6: | |
| o-cresol novolak epoxy acrylate | ... 40% |
| Cresol novolak type epoxy resin | ... 18% |
| Dipentaerythritol hexaacrylate | ... 38% |
| Irgacure 184 | ... 2% |
| UVE1014 (manufactured by GE) | ... 2% |
| Composition Example 7: | |
| Polyurethane acrylate | ... 35% |
| Phenol novolak type epoxy resin | ... 13% |
| Dipentaerythritol hexaacrylate | ... 48% |
| UVE1014 (manufactured by GE) | ... 2% |
| Irgacure 651 | ... 2% |
| Composition Example 8: | |
| Melamine acrylate | ... 49% |
| Phenol novolak type epoxy resin | ... 20% |
| Trimethylolpropane triacrylate | ... 27% |
| UVE1014 (manufactured by GE) | ... 2% |
| Irgacure 184 | ... 2% |
| Composition Example 9: | |
| Phenol novolak epoxy acrylate in which epoxy groups comprise about 30% of acrylate groups | ... 60% |
| Trimethylolpropane triacrylate | ... 17% |
| Dipentaerythritol hexaacrylate | ... 20% |
| Irgacure 184 | ... 3% |
| Composition Example 10: | |
| o-cresol novolak epoxy acrylate in which epoxy groups comprise about 30% of acrylate groups | ... 60% |
| Dipentaerythritol hexaacrylate | ... 38% |
| Irgacure 184 | ... 2% |
| Composition Example 11: | |
| Polyurethane acrylate in which epoxy groups comprise about 30% of acrylate groups | ... 50% |
| Dipentaerythritol hexaacrylate | ... 48% |
| Irgacure 651 | ... 2% |
| Composition Example 12: | |
| Melamine acrylate in which epoxy groups comprise about 30% of acrylate groups | ... 70% |
| Trimethylolpropane triacrylate | ... 27% |
| Irgacure 184 | ... 3% |

Next, one example of the method of producing a protective film employing a photopolymerizable resin composition prepared as described above will be explained with reference to the drawings.

Figure 3A:
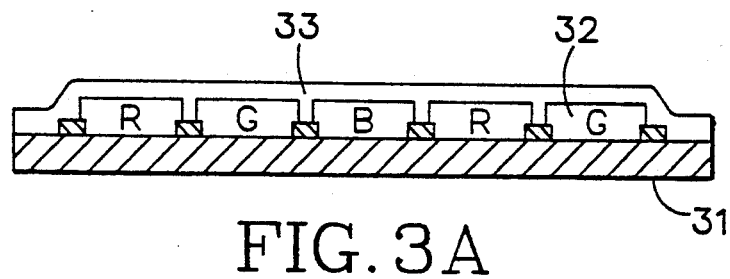
FIGS. 3a-3c shows a process for forming a protective film over a colored layer.
Figure 3B:
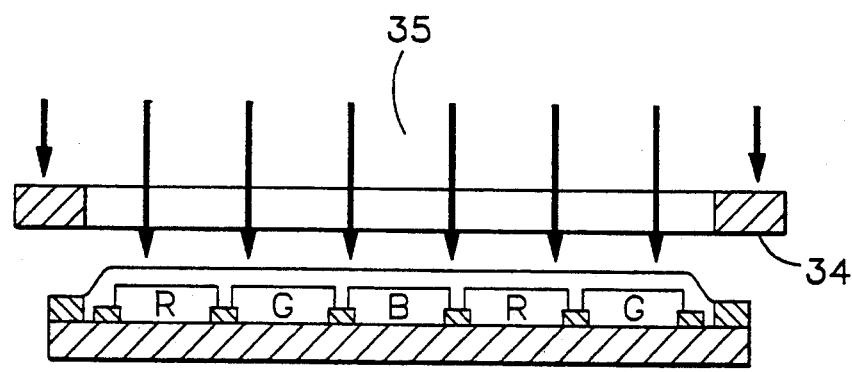
Figure 3C:
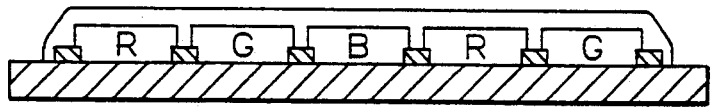

As shown in FIG. 3(A), on a transparent substrate 31 having a colored layer 32 formed thereon, a photopolymerizable resin composition prepared as described above is first coated by a coater, e.g., a spin coater, a roll coater, a dip coater, a wheel coater, or a bar coater, so that the thickness of the dry film is on the order of 0.1 μm to 10 μm, preferably 0.5 μm to 3 μm, thereby forming a photopolymerizable resin composition layer 33. After being dried, the photopolymerizable resin composition layer 33 is irradiated with ionizing radiation 35, e.g., ultraviolet rays, by using a light source, e.g., a xenon lamp, a metal halide lamp, or an extra-high pressure mercury lamp, through a photomask 34 having a predetermined opening pattern, thereby effecting pattern exposure, as shown in FIG. 3(B). As a result of the pattern exposure, irradiated portions are set. Then, the non-irradiated portions are selectively removed by spray development or dip development with water or a developing solution comprising, for example, an organic solvent, as shown in FIG. 3(C).

Figure 4A:
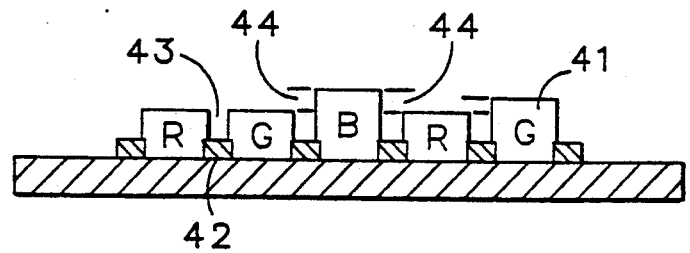
FIGS. 4a-4c is a sectional view showing unevenness of a protective film.
Figure 4B:
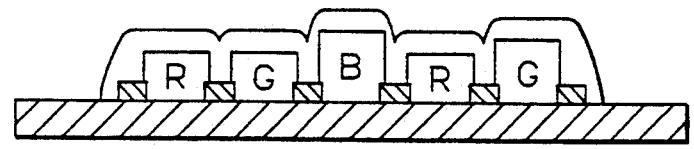
Figure 4C:
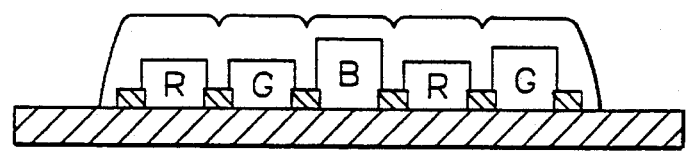

FIG. 4(A) is a sectional view of a color filter formed with a colored layer for explanation of unevenness of a protective film. Colored pixels R, G and B of a colored layer 41 are defined with a black matrix 42. There is a space 43 between each pair of adjacent colored pixels, and there are differences 44 in level between the colored pixels R, G and B. If a protective film is formed over such a colored layer by using a material conventionally employed, relatively large irregularities are produced in the surface of the protective film in accordance with the underlying irregularities, so that the protective film is unfavorable in terms of evenness, as shown in FIG. 4(B). However, in the case of the protective film according to the present invention, even if there are large irregularities under the protective film, no large irregularities are produced in the surface thereof, so that the protective film is extremely excellent in evenness, as shown in FIG. 4(C). As a result, a transparent electrode film formed over the protective film is also excellent in evenness.

Figure 5A:
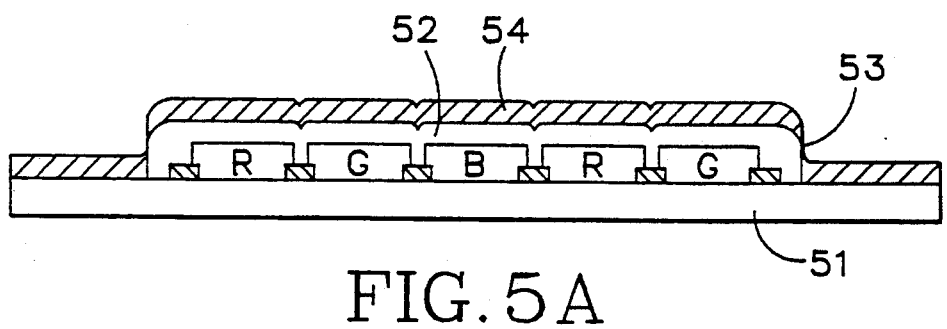
FIGS. 5a-5b is a sectional view showing the change in the thickness of the peripheral edge portion of a protective film.
Figure 5B:
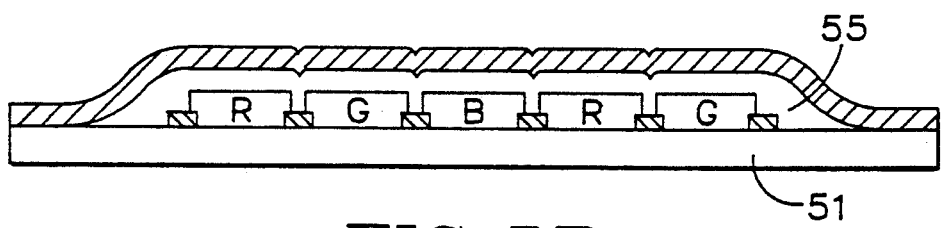

It is possible to form a protective film only in a predetermined region by exposing a photopolymerizable resin composition coating layer coated over a colored layer through a photomask to thereby set it. As shown in FIG. 5(A), which is a sectional view of a color filter formed with a protective film and a transparent electrode film, a step is formed at the peripheral edge portion of a protective film 52 formed over a transparent substrate 51, so that a transparent electrode film 54 formed on the step portion 53 is smaller in thickness than that on the even portion. Thus, there have heretofore been some problems. In particular, when the transparent electrode film is etched, it may be disconnected at the thin portion. However, by effecting exposure in such a manner that the distance between the photomask and the photopolymerizable resin composition is greater than the distance at which the image of the photomask is properly drawn, it is possible to make the peripheral edge portion 53 of the protective film gentle, as shown in FIG. 5(B).

Figure 6:
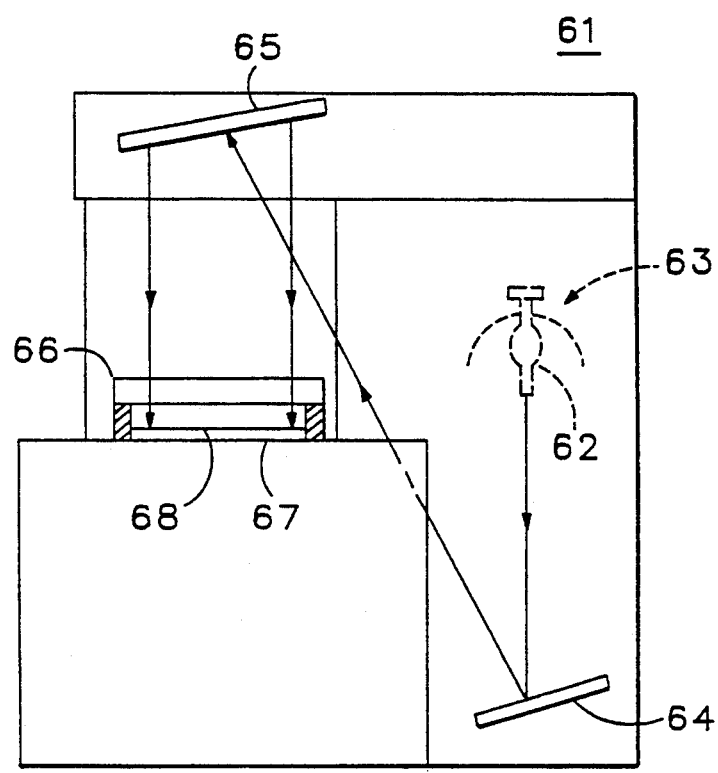
FIG. 6 schematically shows exposure by a proximity aligner.

Such exposure can be effected by using a proximity aligner shown schematically in FIG. 6. A proximity aligner 61 has a light source 62 that emits ultraviolet light, for example, an extra-high pressure mercury lamp. Light from the light source 62 is formed into parallel rays by a parabolic mirror 63. Thereafter, the light path is changed by mirrors 64 and 65, and the light is applied to a photopolymerizable resin composition coating film formed on a substrate 68 placed on an exposure stage 67 through a photomask 66, thereby exposing the coating film.

Figure 7:
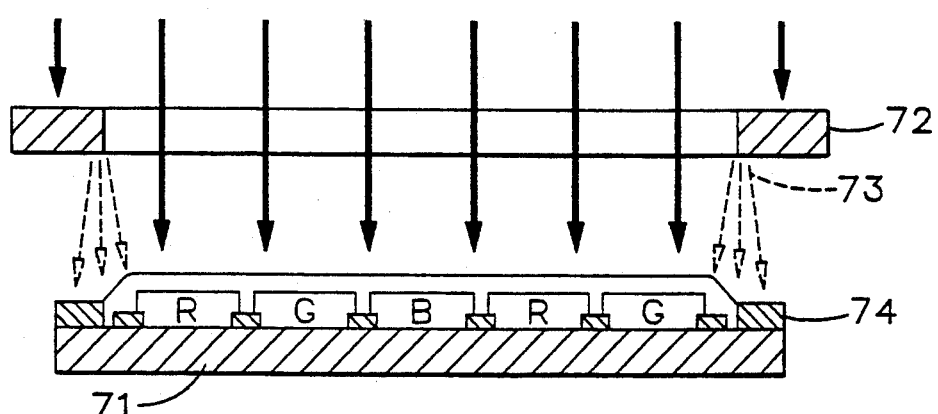
FIG. 7 shows the conditions of exposure in a case where the distance between a photomask and a substrate is greater than the correct one.

FIG. 7 shows the way in which exposure is effected by the apparatus shown in FIG. 6 in such a manner that the distance between the photomask and the coating film is greater than the correct one. In this case, since the distance between a substrate 71 and a photomask 72 is greater than the proper distance for exposure, light passing through the peripheral portion 73 of the opening in the photomask 72 is dispersed, so that the peripheral edge portion 74 of the protective film has no clear distinction between the exposed and non-exposed portions. As a result, the protective film has a gentle slope in thickness at the peripheral edge portion thereof.

Examples will be explained below.

EXAMPLE 1

A glass substrate (7059; manufactured by Corning Inc.) with a thickness of 1.1 mm was employed as a substrate after being washed thoroughly, and colored pixels were formed on the substrate. The formation of colored pixels was carried out as follows:

(A) Formation of colored pixels:

A polyvinyl alcohol derivative in which a repeating unit represented by the following formula was introduced in an amount of 1.2 mol % with respect to the vinyl alcohol constitutional unit and which had an average polymerization degree of 1,700 and a saponification degree of about 88% was prepared:

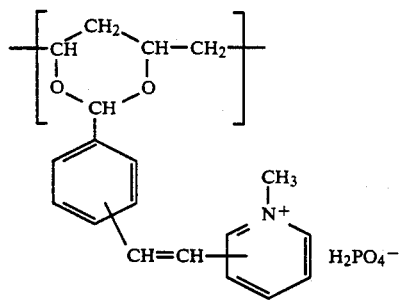

Then, 10 parts by weight of Shimura Fast Pyrazolone Red BT (red pigment; manufactured by Dai-Nippon Ink & Chemicals, Inc.) were added to and mixed with 100 parts by weight of a 10% aqueous solution of the prepared polyvinyl alcohol derivative. The resulting mixture was ground and dispersed in a ball mill, and the resulting dispersion was centrifuged at 10,000 rpm and filtered with a glass filter having a pore diameter of 1 $\mu$m. The particle diameter distribution of the red photosensitive resin composition thus obtained was analyzed by using a Coulter N4 submicron particle analyzer (manufactured by Coulter). As a result, the average particle diameter was 0.17 $\mu$m, and particles having a particle diameter of 0.01 $\mu$m to 0.3 $\mu$m comprised 75% of all the particles. Next, the red photosensitive resin composition was coated on the transparent glass substrate to a film thickness of 1.2 $\mu$m by using a spin coater and then dried for 30 minutes at 70° C. Thereafter, the coating film was subjected to contact pattern exposure through a mosaic photomask. Then, the pattern-exposed photosensitive resin composition was spray-developed with a developing solution comprising water and isopropyl alcohol in a weight ratio of 10:3, thereby selectively removing the non-exposed portions. Thereafter, heating was carried out for 30 minutes at 150° C. to form transparent red pixels.

Next, 10 parts by weight of Lyonol Green 2Y-301 (green pigment; manufactured by Toyo Ink Seizo K.K.) were added to and mixed with 100 parts by weight of a 10% aqueous solution of the above-described polyvinyl alcohol derivative. The resulting mixture was ground and dispersed in a sand mill, and thereafter it was centrifuged at 12,000 rpm and then filtered with a glass filter of 1.0 $\mu$m. The particle diameter distribution of the pigment in the obtained green photosensitive resin composition was analyzed in the same way as the above. As a result, the average particle diameter was 0.13 $\mu$m, and particles having a particle diameter of 0.01 $\mu$m to 0.3 $\mu$m comprised 91% of all the particles.

Next, the green photosensitive resin composition was spin-coated on the whole surface of the glass substrate provided with the above-described red transparent pixels to a film thickness of 1.2 $\mu$m and then dried for 30 minutes at 70° C. Thereafter, the coating film was subjected to pattern exposure through a mask having a predetermined configuration, thereby selectively removing the non-exposed portions, and then drying was carried out. Thus, transparent green pixels were formed in such a manner as to be adjacent to the above-described red transparent pixels.

Similarly, 3 parts by weight of Fast Gen Blue GNPS (blue pigment; manufactured by Dai-Nippon Ink & Chemicals, Inc.) were added to and mixed with 100 parts by weight of a 10% aqueous solution of the above-described polyvinyl alcohol derivative. The resulting mixture was ground and dispersed in a sand mill, and the resulting dispersion was centrifuged at 12,000 rpm and filtered with a glass filter having a pore diameter of 1 $\mu$m. The particle diameter distribution of the pigment of the blue photosensitive resin composition thus obtained was analyzed in the same way as the above. As a result, the average particle diameter was 0.18 $\mu$m, and particles having a particle diameter of 0.01 $\mu$m to 0.3 $\mu$m comprised 75% of all the particles. Next, the blue photosensitive resin composition was spin-coated on the transparent glass substrate provided with the above-described red and green transparent pixels to a film thickness of 1.2 $\mu$m and then dried for 30 minutes at 70° C. Thereafter, the coating film was subjected to pattern exposure through a mask having a predetermined configuration, thereby selectively removing the non-exposed portions, and then drying was carried out. Thus, transparent blue pixels were formed in such a manner as to be adjacent to the green transparent pixels.

(B) Formation of a protective film:

Subsequently, 50 parts by weight of o-cresol novolak epoxy acrylate (molecular weight: 1,500 to 2,000) in which epoxy groups comprised about 30% of the acrylate groups and 50 parts by weight of dipentaerythritol hexaacrylate (DPHA; manufactured by Nippon Kayaku Co., Ltd.) were mixed together as a photopolymerizable acrylate oligomer and a multifunctional polymerizable monomer, and further 2 parts by weight of Irgacure (manufactured by Ciba & Geigy Ltd.) was mixed as a photopolymerization initiator with the resulting mixture to prepare a blend, which was then dissolved in 200 parts by weight of ethyl Cellosolve acetate. Then, 10 g of the resulting solution was coated on the above-described colored layer to a thickness of 2.0 μm by using a spin coater. With a photomask disposed at a distance of 50 μm from the coating film, ultraviolet rays were applied only to the coating film on the colored layer for 10 seconds from an extra-high mercury lamp of 2.0 kW by using a proximity aligner. Subsequently, the coating film was dipped for 1 minute in a developing solution comprising 1,1,2,2-tetrachloroethane at a temperature of 25° C., thereby removing only the uncured portions of the coating film.

Next, the protective film thus formed was coated with an ITO film to a thickness of 0.4 μm by magnetron sputtering.

When the evenness of the transparent electrode layer was measured with a probe type film thickness gauge, irregularities were as small as 0.01 μm to 0.05 μm. Thus, the transparent electrode layer had excellent evenness.

Even when the color filter thus obtained was heated to 250° C., no abnormality was found. Thus, it was confirmed that the color filter had satisfactory heat resistance. The light transmittance was also excellent.

EXAMPLE 2

Ten parts by weight of the polyvinyl alcohol derivative shown in Example 1 were dissolved in 100 parts by weight of water, and 5 parts by weight of Lyonol Green 2Y-301 (green pigment; manufactured by Toyo Ink Seizo K.K.) were added to and mixed with the resulting solution. The resulting mixture was ground and dispersed in a triple roll mill, and thereafter it was centrifuged at 6,000 rpm and then filtered with a glass filter having a pore diameter of 1 μm. Next, the green photosensitive resin composition thus obtained was spin-coated over an 1 mm thick of transparent glass substrate to a film thickness of 1.5 μm and then dried for 30 minutes for 70° C. Thereafter, contact pattern exposure was carried out through a mask. Then, the pattern-exposed photosensitive resin composition was spray-developed with a developing solution comprising water and isopropyl alcohol in a weight ratio of 10:3, thereby selectively removing the unexposed portions. Thereafter, heating was carried out for 30 minutes at 150° C., thus forming green pixels. The transmittance of the green pixels in the region of 600 nm to 700 nm was 1% or less, but the transmittance in the region of 500 nm to 560 nm was 80% or more. The photo-sensitivity of the above-described composition was 4 times that of the conventional gelatin/Cr colored pixels. The edge configuration was substantially the same as that of the gelatin/Cr colored pixels. The particle diameter distribution of the pigment in the green transparent resin composition was analyzed by using a Coulter N4 submicron particle analyzer. As a result, the average particle diameter was 0.08 μm, and particles having a particle diameter of 0.01 μm to 0.3 μm comprised 97% of all the particles.

EXAMPLE 3

After green pixels were formed in the same way as in Example 2 except that the mixture of Lyonol Green 2Y-301 and the polyvinyl alcohol derivative was neither centrifuged nor filtered, the transmittance was measured. As a result, the transmittance in the region of 500 nm to 560 nm was 36.9%. Thus, it was revealed that the green pixels were unusable as colored pixels for a color filter.

EXAMPLE 4

Colored pixels were produced in the same way as in Example 1, and four different protective films were formed: a film formed from a resin material having the same composition as that in Example 1 except that o-cresol novolak epoxy acrylate was used as an acrylate oligomer; a film formed from the resin material used in Example 1; a film formed by coating a 0.1% to 0.2% solution of γ-(2-aminoethyl)-aminopropyl trimethoxy silane (SH6020; manufactured by Toray Silicone K.K.), as a silane coupling agent, on a glass substrate, drying the coating film, and then coating the resin material used in Example 1; and a film formed from the resin material used in Example 1 which had a silane coupling agent added thereto. Then, the bond strength of each of the coating films was evaluated by the cross-cut adhesion test (JIS K5400). Results of the test are shown in Table 1 below. The cross-cut adhesion test was carried out for each coating film after the completion of the process in which a film material was coated on a transparent substrate (7059; manufactured by Corning Inc.) to a thickness of 1.0 μm to 1.5 μm and dried, and the coating film was exposed for 10 seconds by using an extra-high pressure mercury lamp of 2.0 kW so as to be cured and then dipped in boiling water for 60 minutes together with the substrate.

The protective film according to the present invention and the protective films treated with a silane coupling agent had excellent characteristics in terms of the bond strength and showed no change in the characteristics in terms of the transparency and the light transmission properties.

TABLE 1

| Processing method | Evaluation grades | Conditions |
| --- | --- | --- |
| Epoxy acrylate alone | 0 | not less than 65% separated |
| Epoxy group-containing epoxy acrylate | 8 | not more than 5% separated |
| Epoxy group-containing epoxy acrylate, and treatment of substrate with coupling agent | 10 | No separation |
| Epoxy group-containing epoxy acrylate having coupling agent added thereto | 10 | No separation |

EXAMPLE 5

Colored pixels were produced in the same way as in Example 1, and a protective film was formed as follows: 50 parts by weight of o-cresol novolak epoxy acrylate (molecular weight: 1,500 to 2,000), as a photopolymerizable acrylate oligomer, and 50 parts by weight of dipentaerythritol hexaacrylate (DPHA; manufactured by Nippon Kayaku Co., Ltd.), as a multifunctional polymerizable monomer, were mixed together, and 2 parts by weight of Irgacure (manufactured by Ciba & Geigy Ltd.) were mixed with the resulting mixture to form a blend, which was then dissolved in 200 parts by weight of ethyl Cellosolve acetate. Then, 10 g of the resulting solution was coated on the above-described colored layer to a thickness of 2.0 μm by using a spin coater. With a photomask disposed, ultraviolet rays were applied only to the coating film on the colored layer for 10 seconds from an extra-high mercury lamp of 2.0 kW by using a proximity aligner. Subsequently, the coating film was dipped for 1 minute in a developing solution comprising 1,1,2,2-tetrachloroethane at a temperature of 25° C., thereby removing only the uncured portions of the coating film.

Next, the protective film thus formed was coated with an ITO film to a thickness of 0.4 μm by magnetron sputtering.

When the evenness of the transparent electrode layer was measured with a probe type film thickness gauge, irregularities were as small as 0.01 μm to 0.05 μm. Thus, the transparent electrode layer had excellent evenness.

Even when the color filter thus obtained was heated to 250° C., no abnormality was found. Thus, it was confirmed that the color filter had satisfactory heat resistance.

EXAMPLE 6

The bond strength of each of the following coating films was evaluated by the cross-cut adhesion test (JIS K5400): a film formed by coating a 0.1% to 0.2% solution of γ-(2-aminoethyl)-aminopropyl trimethoxy silane (SH6020; manufactured by Toray Silicone K.K.), as a silane coupling agent, on a glass substrate, and then coating a resin composition having the same composition as that of the resin composition used in Example 5; and a film formed from the resin composition used in Example 5 which had a silane coupling agent added thereto. Results of the test are shown in Table 2 below. In Table 2, "Treatment of substrate" means the treatment of the substrate with a silane coupling agent, and "Addition to resin" means the addition of a silane coupling agent to the resin material used in Example 5.

The protective film according to the present invention and the protective film treated with a silane coupling agent had excellent characteristics in terms of the bond strength and showed no change in the characteristics in terms of the transparency and the light transmission properties.

TABLE 2

| Processing method | Evaluation grades | Conditions |
| --- | --- | --- |
| Resin used in Example 5 | 0 | not less than 65% separated |
| Treatment of substrate | 10 | No separation |
| Addition to resin | 10 | No separation |

EXAMPLE 7

A color filter was produced in the same way as in Example 1 except that the following material was used as a photopolymerizable protective film composition.

As a photopolymerizable acrylate oligomer, 35 parts by weight of o-cresol novolak epoxy acrylate (molecular weight: 1,500 to 2,000) and 15 parts by weight of a cresol novolak type epoxy resin, and as a multifunctional polymerizable monomer, 50 parts by weight of dipentaerythritol hexaacrylate (DPHA; manufactured by Nippon Kayaku Co., Ltd.) were mixed together, and the resulting mixture was further mixed with 2 parts by weight of Irgacure (manufactured by Ciba & Geigy Ltd.), as a polymerization initiator, and 2 parts by weight of UVE1014 (manufactured by General Electric Co.), as an epoxy curing agent. The resulting blend was dissolved in 200 parts by weight of ethyl Cellosolve acetate. Then, 10 g of the resulting solution was coated on the above-described colored layer to a thickness of 2.0 μm by using a spin coater. With a photomask disposed at a distance of 100 μm from the coating film, ultraviolet rays were applied only to the surface of the colored layer for 10 seconds from an extra-high mercury lamp of 2.0 kW by using a proximity aligner. Subsequently, the coating film was dipped for 1 minute in a developing solution comprising 1,1,2,2-tetrachloroethane at a temperature of 25° C., thereby removing only the uncured portions of the coating film.

The hardness of the resulting protective film was equivalent to 7H in terms of the pencil hardness.

Next, the protective film thus formed was coated with an ITO film to a thickness of 0.4 μm by magnetron sputtering.

When the evenness of the transparent electrode layer was measured with a probe type film thickness gauge, irregularities were as small as 0.01 μm to 0.05 μm. Thus, the transparent electrode layer had excellent evenness.

Even when the color filter thus obtained was heated for 1 hour at 250° C., no abnormality was found. Thus, it was confirmed that the color filter had satisfactory heat resistance.

EXAMPLE 8

Color filters were produced in the same way as in Example 7 except that the following photopolymerizable compositions were used.

(a) A film formed from a resin material obtained by mixing together 50 parts by weight of o-cresol novolak epoxy acrylate (molecular weight: 1,500 to 2,000) and 50 parts by weight of dipentaerythritol hexaacrylate (DPHA; manufactured by Nippon Kayaku Co., Ltd.) and further mixing the resulting mixture with 2 parts by weight of Irgacure (manufactured by Ciba & Geigy Ltd.), as a polymerization initiator.

(b) A film formed from the resin material used in Example 7.

(c) A film formed by coating a 0.1% solution of γ-(2-aminoethyl)-aminopropyl trimethoxy silane (SH6020; manufactured by Toray Silicone K.K.), as a silane coupling agent, on a glass substrate, drying the coating film, and then coating the resin material used in Example 7.

(d) A film formed from the resin material used in Example 7 which had a silane coupling agent added thereto.

Then, the bond strength of each of the coating films was evaluated by the cross-cut adhesion test (JIS K5400). Results of the test are shown in Table 3 below. The cross-cut adhesion test was carried out for each coating film after the completion of the process in which a film material was coated on a transparent substrate (7059; manufactured by Corning Inc.) to a thickness of 1.0 μm to 1.5 μm and dried, and the coating film was exposed for 10 seconds by using an extra-high pressure mercury lamp of 2.0 kW so as to be cured and then dipped in boiling water for 60 minutes together with the substrate.

TABLE 3

| Processing method | Evaluation grades | Conditions |
| --- | --- | --- |
| (a) Epoxy acrylate alone | 0 | not less than 65% separated |
| (b) Epoxy resin-containing epoxy acrylate | 8 | not more than 5% separated |
| (c) Epoxy resin-containing epoxy acrylate, and treatment of substrate with coupling agent | 10 | No separation |
| (d) Epoxy resin-containing | 10 | No separation |

TABLE 3-continued

| Processing method | Evaluation grades | Conditions |
|---|---|---|
| epoxy acrylate having coupling agent added thereto | | |

EXAMPLE 9

In the same way as in Example 7, as a photopolymerizable acrylate oligomer, 50 parts by weight of o-cresol novolak epoxy acrylate (molecular weight: 1,500 to 2,000) and, as a multifunctional polymerizable monomer, 50 parts by weight of dipentaerythritol hexaacrylate (DPHA; manufactured by Nippon Kayaku Co., Ltd.) were mixed together, and the resulting mixture was further mixed with 2 parts by weight of Irgacure (manufactured by Ciba & Geigy Ltd.), as a polymerization initiator. The resulting blend was dissolved in 200 parts by weight of ethyl Cellosolve acetate. Then, 10 g of the resulting solution was coated on the colored layer to a thickness of 2.0 $\mu$m by using a spin coater.

Subsequently, with a photomask disposed at a distance of 500 $\mu$m, exposure was carried out by using the proximity aligner shown in FIG. 6.

The exposure was effected in such a manner that ultraviolet rays were applied only to the coating film on the colored layer for 10 seconds by using an extra-high pressure mercury lamp of 2.0 kW. Subsequently, the coating film was dipped for 1 minute in a developing solution comprising 1,1,2,2-tetrachloroethane at a temperature of 25° C., thereby removing only the uncured portions of the coating film.

The section of the peripheral edge portion of the resulting protective film had a gentle slope at about 10 degrees to the substrate.

Next, the protective film thus formed was coated with an ITO film to a thickness of 0.4 $\mu$m by magnetron sputtering.

Then, the ITO film was etched with an etching solution comprising ferric chloride and hydrochloric acid, thereby obtaining a color filter formed with the ITO patterns having a line width of 100 $\mu$m and a spacing of 20 $\mu$m. The transparent electrode layer had a sufficiently high bond strength at the peripheral edge portion, so that no disconnection occurred.

EXAMPLE 10

A protective film was formed in the same way as in Example 7 except that the distance between the photomask and the coating film was 300 $\mu$m. The section of the peripheral edge portion of the resulting protective film had a gentle slope at about 15 degrees to the substrate.

Next, the protective film thus formed was coated with an ITO film to a thickness of 0.4 $\mu$m by magnetron sputtering.

Then, the ITO film was etched with an etching solution comprising ferric chloride and hydrochloric acid, thereby obtaining a color filter formed with the ITO patterns having a line width of 100 $\mu$m and a spacing of 20 $\mu$m. The transparent electrode layer had a sufficiently high bond strength at the peripheral edge portion, so that no disconnection occurred.

EXAMPLE 11

A protective film was formed in the same way as in Example 1 except that no multifunctional photopolymerizable monomer was added.

The hardness of the resulting protective film was equivalent to HB to 2H in terms of the pencil hardness.

Subsequently, the protective film was coated with an ITO film in the same way as in the example. Wrinkles were developed in the ITO film having a thickness of 0.15 $\mu$m. Irregularities were 0.1 $\mu$m to 0.5 $\mu$m, and the heat resistance was 220° C.

EXAMPLE 12

A protective film was formed in the same way as in Example 1 except that a thermosetting acrylate (trademark JSS181, manufactured by Japan Synthetic Rubber Co., Ltd.) was employed as a protective film material and the curing of the protective film was effected by heating for 1 hour at 180° C.

The hardness of the resulting protective film was equivalent to HB to 4H in terms of the pencil hardness.

Subsequently, the protective film was coated with an ITO film in the same way as in the example. Wrinkles were developed in the ITO film having a thickness of 0.1 $\mu$m. Irregularities were 0.2 $\mu$m to 0.7 $\mu$m, and the heat resistance was 200° C.

EXAMPLE 13

A protective film was formed in the same way as in the example except that a thermosetting epoxy resin (trademark CZ-003, manufactured by Nissan Chemicals Industries Ltd.) was employed as a protective film material and the curing of the protective film was effected by heating for 1 hour at 180° C.

The hardness of the resulting protective film was equivalent to HB to 2H in terms of the pencil hardness.

Subsequently, the protective film was coated with an ITO film in the same way as in the example. Wrinkles were developed in the ITO film having a thickness of 0.1 $\mu$m. Irregularities were 0.2 $\mu$m to 0.7 $\mu$m, and the heat resistance was not higher than 200° C.

EXAMPLE 14

A protective film was formed in the same way as in the example except that a silicone resin (trademark TDA1H, manufactured by Shokubai Kasei K.K.) was employed as a protective film material and the curing of the protective film was effected by heating for 1 hour at 180° C.

The hardness of the resulting protective film was equivalent to 3H to 9H in terms of the pencil hardness, and the heat resistance was excellent, i.e., not lower than 250° C. However, when the protective film was coated with an ITO film in the same way as in the example, there were cracks in the ITO film having a thickness of not less than 0.2 $\mu$m. Irregularities were 0.2 $\mu$m to 0.7 $\mu$m.

EXAMPLE 15

A color filter was produced in the same way as in Example 7 except that the distance between the photomask and the coating film was 100 $\mu$m. The section of the peripheral edge portion of the resulting protective film had a slope at about 23 degrees to the substrate. Next, an ITO film was formed over the protective film in the same way as in Example 1 and then etched to thereby obtain a color filter formed with the ITO patterns having a line width of 100 $\mu$m and a spacing of 20 $\mu$m.

The transparent electrode layer had a low bond strength at the peripheral edge portion, so that disconnection occurred.

EXAMPLE 16

A color filter was produced in the same way as in Example 7 except that the distance between the photomask and the coating film was 50 μm. The section of the peripheral edge portion of the resulting protective film had a slope at about 31 degrees to the substrate. Next, an ITO film was formed over the protective film in the same way as in Example 1 and then etched to thereby obtain a color filter formed with the ITO patterns having a line width of 100 μm and a spacing of 20 μm.

The transparent electrode layer had a low bond strength at the peripheral edge portion, so that disconnection occurred.

EXAMPLE 17

A color filter was produced in the same way as in Example 7 except that the distance between the photomask and the coating film was 30 μm. The section of the peripheral edge portion of the resulting protective film had a slope at about 36 degrees to the substrate. Next, an ITO film was formed over the protective film in the same way as in Example 1 and then etched to thereby obtain a color filter formed with the ITO patterns having a line width of 100 μm and a spacing of 20 μm.

The transparent electrode layer had a low bond strength at the peripheral edge portion, so that disconnection occurred.

Figure 8:
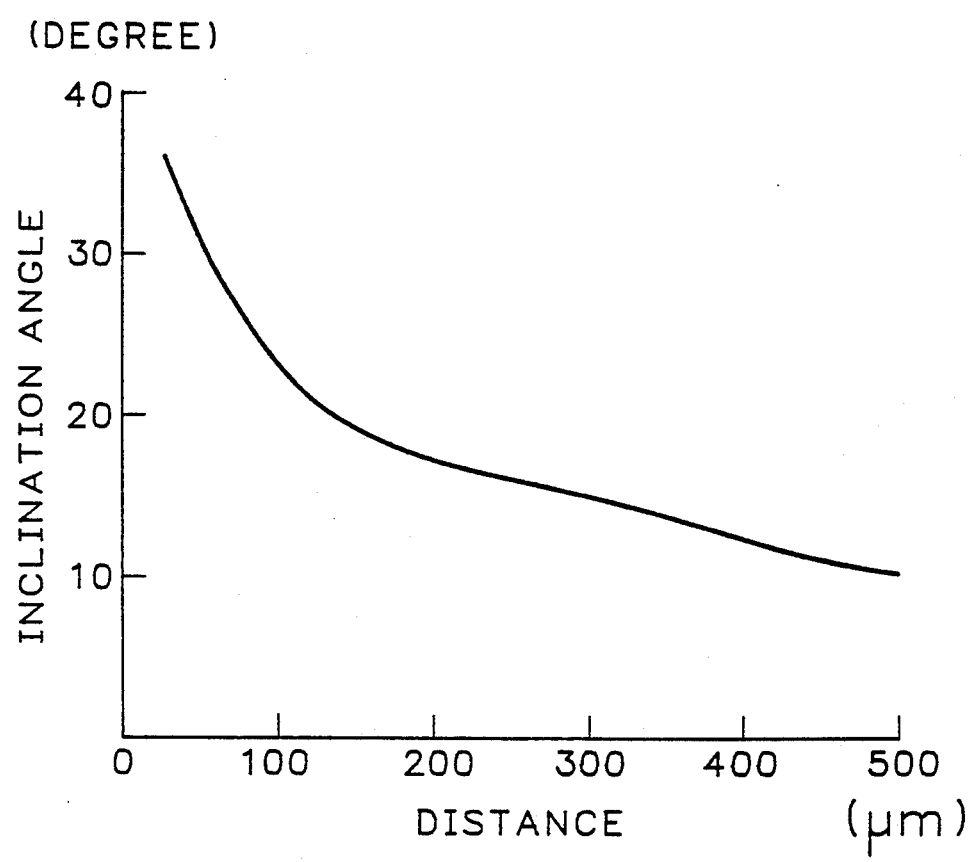
FIG. 8 is a graph showing the relationship between the distance for exposure by a proximity aligner and the magnitude of the angle of inclination of the peripheral edge portion of the resulting protective film.

As shown in FIG. 8, in which the distance between the photomask and the coating film is plotted along the abscissa axis and the angle of inclination of the peripheral edge portion of the protective film is plotted along the ordinate axis, the inclination angle can be reduced by setting the distance between the photomask and the photopolymerizable resin composition coating film to be greater than the correct distance.

INDUSTRIAL APPLICABILITY

The color filter according to the present invention and a liquid crystal display using it use a transparent resin material to form a colored layer, the material having a pigment dispersed therein which has such a particle diameter distribution that particles having a particle diameter of 1 μm or more comprise not more than 5% of all the pigment particles by weight. Accordingly, the light transmittance in the light absorbing region on the spectral characteristic curve in the visible region is not more than 20%, while the light transmittance in the light transmitting region is not less than 50%. In addition, since the colored layer is superior in both heat resistance and light resistance, it is not deteriorated during the heat treatment in the process of producing the color filter. Further, the protective film that is formed over the colored layer has sufficiently high heat resistance and hardness, and the peripheral edge portion of the protective film is gentle, so that a transparent electrode film of excellent characteristics can be formed over the protective film. Thus, it is possible to provide a color filter and a color liquid crystal display, which provide superior display quality.

What is claimed is:

1. A method of producing a color filter having a protective film formed over colored pixels formed on a transparent substrate by curing a photopolymerizable resin composition, comprising the steps of: irradiating only a predetermined region of a photopolymerizable resin composition coating film with light to cure said region; and dissolvingly removing the uncured portion of the photopolymerizable resin composition by using a solution which is compatible with the photopolymerizable resin composition in the uncured region, thereby forming a protective film only in a predetermined region, wherein said irradiation with light is effected through a photomask that is disposed at a distance which is greater than the correct distance between the photomask and the coating film, thereby dispersing light passing through the peripheral portion of the opening in the photomask so as to change the film thickness of the peripheral edge portion of the protective film.

2. A color filter according to claim 1, wherein said colored pixels are formed from a transparent resin material having a pigment dispersed therein.

3. A color filter comprising a transparent substrate, colored pixels formed on said substrate, and a protective film formed over said pixels, wherein said protective film comprises a cured photopolymerizable resin composition which contains at least a photopolymerizable acrylate oligomer and a multifunctional photopolymerizable acrylate monomer having at least two functional groups in one molecule, and wherein said photopolymerizable resin composition is coated on a silane coupling agent film, which is on said transparent substrate.

4. A color filter comprising a transparent substrate, colored pixels formed on said substrate, and a protective film formed over said pixels, wherein said protective film comprises a cured photopolymerizable resin composition which contains at least a photopolymerizable acrylate oligomer and dipentaerythritol hexaacrylate and wherein said photopolymerizable resin composition is coated with a silane coupling agent added thereto.

5. A color filter according to claim 4, wherein the thickness of the peripheral edge portion of said protective film varies gently.

6. A color filter according to claim 4, wherein said colored pixels are formed from a transparent resin material having a pigment dispersed therein.

7. A color filter comprising a transparent substrate, colored pixels formed on said substrate, and a protective film formed over said pixels, wherein said protective film comprises a cured photopolymerizable resin composition which contains at least a photopolymerizable acrylate oligomer and dipentaerythritol hexaacrylate and wherein the thickness of the peripheral edge portion of said protective film varies gently.

8. A color filter according to claim 7, wherein said colored pixels are formed from a transparent resin material having a pigment dispersed therein.

9. A color filter comprising a transparent substrate, colored pixels formed on said substrate, and a protective film formed over said pixels, wherein said protective film comprising a cured photopolymerizable resin composition which contains at least a photopolymerizable acrylate oligomer and dipentaerythritol hexaacrylate, wherein said colored pixels are formed from a transparent resin material having a pigment dispersed therein.

10. A method of producing a color filter having a protective film formed over colored pixels formed on a transparent substrate by curing a photopolymerizable resin composition, comprising the steps of: irradiating only a predetermined region of a photopolymerizable resin composition coating film with light to cure said region; and dissolvingly removing the uncured portion of the photopolymerizable resin composition by using a solution which is compatible with the photopolymerizable resin composition in the uncured region, thereby forming a protective film only in a predetermined region, wherein said photopolymerizable resin composition is coated on a silane coupling agent film, which is on said transparent substsrate.

11. A method of producing a color filter having a protective film formed over colored pixels formed on a transparent substrate by curing a photopolymerizable resin composition, comprising the steps of: irradiating only a predetermined region of a photopolymerizable resin composition coating film with light to cure said region; and dissolvingly removing the uncured portion of the photopolymerizable resin composition by using a solution which is compatible with the photopolymerizable resin composition in the uncured region, thereby forming a protective film only in a predetermined region, wherein said photopolymerizable resin composition is coated with silane coupling agent added thereto.

* * * * *